United States Patent
Hsu et al.

(10) Patent No.: US 8,253,615 B2
(45) Date of Patent: Aug. 28, 2012

(54) CURRENT SENSING CIRCUIT

(75) Inventors: Chen-Ming Hsu, Tainan County (TW); Yaw-Guang Chang, Tainan County (TW)

(73) Assignee: Himax Technologies Limited, Tainan (TW)

( * ) Notice: Subject to any disclaimer, the term of this patent is extended or adjusted under 35 U.S.C. 154(b) by 55 days.

(21) Appl. No.: 12/961,865

(22) Filed: Dec. 7, 2010

(65) Prior Publication Data

US 2012/0139770 A1 Jun. 7, 2012

(51) Int. Cl.
*H03M 1/34* (2006.01)

(52) U.S. Cl. ......... 341/164; 341/155; 341/156; 341/165

(58) Field of Classification Search .................. 341/155, 341/164, 156, 165

See application file for complete search history.

(56) References Cited

U.S. PATENT DOCUMENTS

| | | | |
|---|---|---|---|
| 7,733,262 B2* | 6/2010 | Baker | 341/164 |
| 2006/0227641 A1* | 10/2006 | Baker | 365/207 |

* cited by examiner

*Primary Examiner* — Jean B Jeanglaude

(74) *Attorney, Agent, or Firm* — J.C. Patents

(57) ABSTRACT

A current sensing circuit including a current sensing unit, a feedback control unit, and a digital output unit is provided. The current sensing unit senses a current and generates a pulse signal according to at least one reference signal and at least one feedback signal. The feedback control unit is coupled to the current sensing unit and generates the at least one feedback signal according to a clock signal and the pulse signal. The digital output unit is coupled to the current sensing unit and outputs a digital signal according to the pulse signal. The digital output unit counts an amount of pulses of the pulse signal in a predetermined time period to output the digital signal, wherein the amount of pulses is positively correlated with a value of the current.

8 Claims, 6 Drawing Sheets

CURRENT SENSING CIRCUIT

BACKGROUND

1. Field of the Invention

The invention relates to a sensing circuit. Particularly, the invention relates to a current sensing circuit.

2. Description of Related Art

A current sensing technique is widely applied for power management or sensor reading. Taking the sensor reading as an example, optical sensors are widely applied in mobile phones, handheld devices and image displays. Most of the optical sensors apply a photodiode structure. The optical sensor may generate different currents according to different intensities of sensed light.

Generally, to facilitate a signal process, a current value read by the sensor is generally converted into a digital signal. In a conventional technique, a commonly used signal processing method is to first convert a current into a voltage, and then a voltage-type analog-to-digital converter (ADC) is used to convert the voltage into a digital signal for the signal process. However, according to the foregoing digital signal converting method, besides that a circuit complexity cannot be reduced, an offset effect or a nonlinearity effect of the digital signal is occurred, and in applications of slow current variation, a high bit resolution cannot be achieved.

SUMMARY OF THE INVENTION

The invention is directed to a current sensing circuit, which can mitigate an offset effect and a nonlinearity effect occurred due to current-voltage conversion, and achieve high bit resolution in applications of slow current variation.

The invention provides a current sensing circuit including a current sensing unit, a feedback control unit, and a digital output unit. The current sensing unit senses a current and generates a pulse signal according to at least one reference signal and at least one feedback signal. The feedback control unit is coupled to the current sensing unit and generates the at least one feedback signal according to a clock signal and the pulse signal. The digital output unit is coupled to the current sensing unit and outputs a digital signal according to the pulse signal. The digital output unit counts an amount of pulses of the pulse signal in a predetermined time period to output the digital signal, wherein the amount of pulses is positively correlated with a value of the current.

In an embodiment of the invention, the current sensing unit includes a sensing unit and a comparison unit. The sensing unit senses the current, and generates a sensing voltage according to a first reference signal and the at least one feedback signal. The comparison unit is coupled to the sensing unit, and compares levels of the sensing voltage and a second reference signal to output the pulse signal.

In an embodiment of the invention, the sensing unit includes an operation amplifier, a first capacitor and a second capacitor. The operation amplifier includes a first terminal, a second terminal and an output terminal. The first terminal receives the current according to a first feedback signal, the second terminal is coupled to the first reference signal, and the output terminal outputs the sensing voltage. One end of the first capacitor is coupled to the output terminal of the operation amplifier, and another end of the first capacitor is coupled to the first terminal of the operation amplifier. One end of the second capacitor is coupled to the first terminal of the operation amplifier or a first voltage according to a second feedback signal and a third feedback signal. Another end of the second capacitor is coupled to the first reference signal or a second voltage according to the second feedback signal and the third feedback signal.

In an embodiment of the invention, the comparison unit includes a comparator. The comparator includes a first terminal, a second terminal and an output terminal. The first terminal is coupled to the output terminal of the operation amplifier for receiving the sensing voltage. The second terminal is coupled to a second reference signal. The comparator compares the sensing voltage and the second reference signal to output the pulse signal through the output terminal.

In an embodiment of the invention, the sensing unit includes an operation amplifier, a first capacitor and a second capacitor. The operation amplifier includes a first terminal, a second terminal and an output terminal. The current flows out from the first terminal according to a first feedback signal, the second terminal is coupled to the first reference signal, and the output terminal outputs the sensing voltage. One end of the first capacitor is coupled to the output terminal of the operation amplifier, and another end of the first capacitor is coupled to the first terminal of the operation amplifier. One end of the second capacitor is coupled to the first reference signal or a first voltage according to a second feedback signal and a third feedback signal. Another end of the second capacitor is coupled to the first terminal of the operation amplifier or a second voltage according to the second feedback signal and the third feedback signal.

In an embodiment of the invention, the comparison unit includes a comparator. The comparator includes a first terminal, a second terminal and an output terminal. The first terminal is coupled to a second reference signal. The second terminal is coupled to the output terminal of the operation amplifier for receiving the sensing voltage. The comparator compares the sensing voltage and the second reference signal to output the pulse signal through the output terminal.

In an embodiment of the invention, the feedback control unit includes a first inverter, an AND gate and a second inverter. The first inverter is coupled to the current sensing unit for inverting the pulse signal, so as to generate a first feedback signal. The AND gate includes a first terminal, a second terminal and an output terminal. The first terminal is coupled to the current sensing unit for receiving the pulse signal. The second terminal receives the clock signal. The AND gate outputs a second feedback signal through the output terminal according to the pulse signal and the clock signal. The second inverter is coupled to the AND gate for inverting the second feedback signal, so as to generate a third feedback signal.

In an embodiment of the invention, the digital output unit includes an N-bit counter. The N-bit counter is coupled to the current sensing unit. The N-bit counter counts the amount of pulses of the pulse signal in the predetermined time period to output the digital signal.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

In exemplary embodiments of the invention, a current sensing circuit can directly convert a current into a digital signal without using a conventional voltage-type analog-to-digital converter (ADC), so that a process of current-voltage conversion is simplified, by which not only a circuit complexity is reduced, but also an offset effect or a nonlinearity effect of the digital signal caused by current-voltage conversion can be mitigated. Moreover, in the exemplary embodiments of the invention, besides eliminating the nonlinearity effect caused by current-voltage conversion, the current sensing circuit can also achieve a high bit resolution in applications of slow current variation.

First Embodiment

Figure 1:
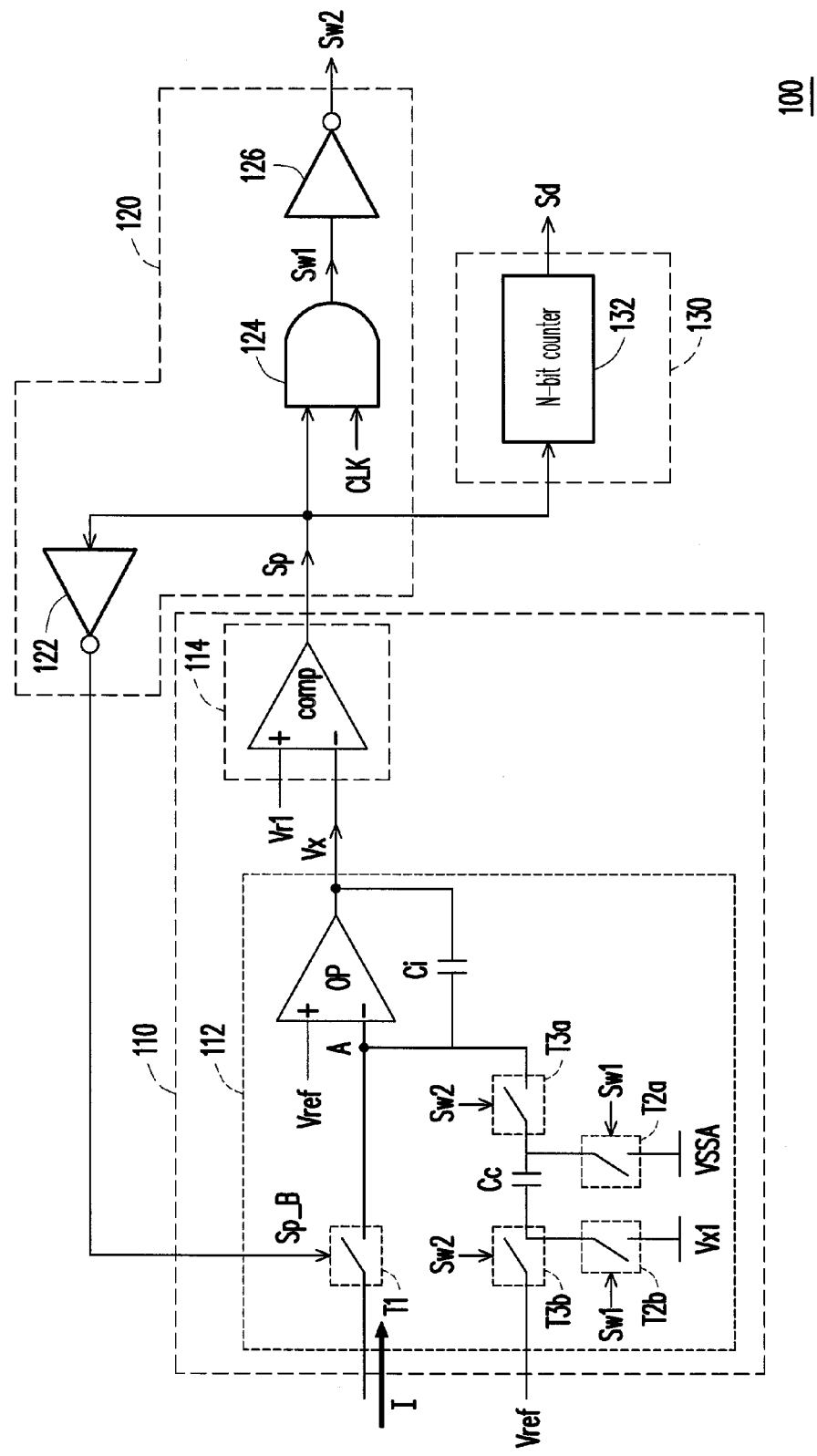
FIG. 1 is a schematic diagram illustrating a current sensing circuit according to a first embodiment of the invention.

FIG. 1 is a schematic diagram illustrating a current sensing circuit according to a first embodiment of the invention. Referring to FIG. 1, in the embodiment, the current sensing circuit 100 includes a current sensing unit 110, a feedback control unit 120 and a digital output unit 130.

The current sensing unit 110 senses an inflow current I, and generates a pulse signal Sp according to reference signals Vref and Vr1 and feedback signal Sp_B, Sw1 and Sw2. The feedback control unit 120 is coupled to the current sensing unit 110 and generates the feedback signals Sp_B, Sw1 and Sw2 according to a clock signal CLK and the pulse signal Sp. The digital output unit 130 is coupled to the current sensing unit 110 and outputs a digital signal Sd according to the pulse signal Sp. The digital output unit 130 counts an amount of pulses of the pulse signal Sp in a predetermined time period to output the digital signal Sd, wherein the amount of pulses of the pulse signal Sp is positively correlated with a value of the current I to be sensed. In other words, in the present embodiment, the current sensing circuit 100 can directly convert the current I into the digital signal Sd without using the conventional voltage-type ADC.

In detail, the current sensing unit 110 includes a sensing unit 112 and a comparison unit 114. The sensing unit 112 senses the current I, and generates a sensing voltage Vx according to a first reference signal Vref and the feedback signals Sp_B, Sw1 and Sw2. The comparison unit 114 is coupled to the sensing unit 112, and compares levels of the sensing voltage Vx and a second reference signal Vr1 to output the pulse signal Sp.

In the present embodiment, the sensing unit 112 includes an operation amplifier OP, a first capacitor Ci and a second capacitor Cc. An inverting terminal (i.e. a first terminal) of the operation amplifier OP receives the current I according to a first feedback signal Sp_B. A non-inverting terminal (i.e. the second terminal) of the operation amplifier OP is coupled to the first reference signal Vref. An output terminal of the operation amplifier OP outputs the sensing voltage Vx. Here, a switch T1 is disposed on a path that the operation amplifier OP receives the current I, and a conducting state of the switch T1 is controlled by the first feedback signal Sp_B, so that the inverting terminal of the operation amplifier OP determines whether or not to receive the current I according to the first feedback signal Sp_B.

One end of the first capacitor Ci is coupled to the output terminal of the operation amplifier OP, and another end thereof is coupled to the inverting terminal (i.e. a node A) of the operation amplifier OP. One end of the second capacitor Cc is coupled to the inverting terminal of the operation amplifier OP or a first voltage VSSA according to a second feedback signal Sw1 and a third feedback signal Sw2. Another end of the second capacitor Cc is coupled to the first reference signal Vref or a second voltage Vx1 according to the second feedback signal Sw1 and the third feedback signal Sw2. Here, a circuit pattern of the second capacitor Cc, switches T2a, T2b, T3a and T3b and the corresponding feedback signals Sw1 and Sw2 is a standard switch capacitor, which forms an equivalent positive resistance. Therefore, a function of the sensing unit 112 is similar to that of an integrator.

In the present embodiment, the comparison unit 114 includes a comparator comp. An inverting terminal (i.e. a first terminal) of the comparator comp is coupled to the output terminal of the operation amplifier OP for receiving the sensing voltage Vx. A non-inverting terminal (i.e. a second terminal) of the comparator comp is coupled to the second reference signal Vr1. The comparator comp compares the sensing voltage Vx and the second reference signal Vr1 to output the pulse signal Sp through an output terminal thereof.

In the present embodiment, the feedback control unit 120 includes a first inverter 122, an AND gate 124 and a second inverter 126. The first inverter 122 is coupled to the current sensing unit 110 for inverting the pulse signal Sp, so as to generate the first feedback signal Sp_B. An input terminal (i.e. a first terminal) of the AND gate 124 is coupled to the current sensing unit 110 for receiving the pulse signal Sp. Another input terminal (i.e. a second terminal) of the AND gate 124 receives the clock signal CLK. The AND gate 124 outputs the second feedback signal Sw1 through its output terminal according to the pulse signal Sp and the clock signal CLK. Therefore, when the pulse signal Sp and the clock signal CLK all have a high level, the AND gate 124 outputs the second feedback signal Sw1 with the high level, and as long as one of the pulse signal Sp and the clock signal CLK has a low level, the AND gate 124 outputs the second feedback signal Sw1 with the low level. The second inverter 126 is coupled to the AND gate 124 for inverting the second feedback signal Sw1, so as to generate the third feedback signal Sw2.

In the present embodiment, the digital output unit 130 includes an N-bit counter 132. The N-bit counter 132 is coupled to the current sensing unit 110. The N-bit counter 132 counts the amount of pulses of the pulse signal Sp in the predetermined time period to output the digital signal Sd. Here, the amount of pulses of the pulse signal Sp is positively correlated with the value of the current I. In other words, the greater the amount of pulses of the pulse signal Sp that is counted by the N-bit counter 132 in the predetermined time period is, the greater the value of the current I sensed by the current sensing unit 110 is.

Figure 2:
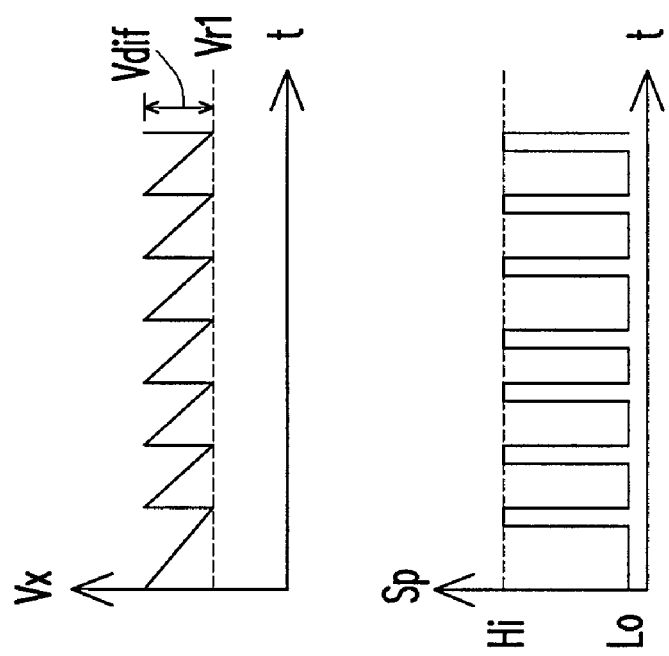
FIG. 2 is a signal waveform diagram of a sensing voltage and a pulse signal according to the first embodiment of the invention.

In detail, FIG. 2 is a signal waveform diagram of the sensing voltage and the pulse signal. Referring to FIG. 1 and FIG. 2, based on a virtual short-circuit principle of the operation amplifier, a voltage of the node A is equal to the first reference signal Vref. In the present embodiment, a voltage magnitude of the first reference signal Vref is adjustable, so that after the current I flows to the node A, it directly flows into the first capacitor Ci. Since the voltage of the node A is constant, a magnitude of the sensing voltage Vx is decreased as the current I flows into the first capacitor Ci, and a falling slope (i.e. dV/dt) thereof is equal to I/Ci. Therefore, the greater the current I is, the greater (the steeper) an absolute value of the slop is.

In the present embodiment, the output terminal of the operation amplifier OP is coupled to the comparator comp, and the comparator comp is used for comparing the sensing voltage Vx and the second reference signal Vr1. When the sensing voltage Vx is smaller than the second reference signal Vr1, the comparator comp outputs the pulse signal Sp with a high level. Now, the high level pulse signal Sp turns off the switch T1, and activates a charge-discharge mechanism of the second capacitor Cc, by which charges stored in the second capacitor Cc is stored into the first capacitor Ci, so that the sensing voltage Vx is increased by Vdif, where Vdif is a voltage difference of the sensing voltages Vx before and after being increased, and a magnitude thereof is Vdif=Vx1×Cc/Ci. Then, the comparator comp outputs the pulse signal Sp with the low level, so as to turn on the switch T1, so that the operation amplifier OP receives the current I until the sensing voltage Vx is again decreased to be smaller than the second reference signal Vr1, and accordingly the comparator comp outputs the pulse signal Sp with the high level. Therefore, within the predetermined time period, the N-bit counter counts the amount of pulses of the pulse signal Sp (i.e. the number of the high level pulse signals Sp), and the amount of the pulses represents the value of the current I sensed by the current sensing unit 110, which is a final digital output of the current value.

Figure 3:
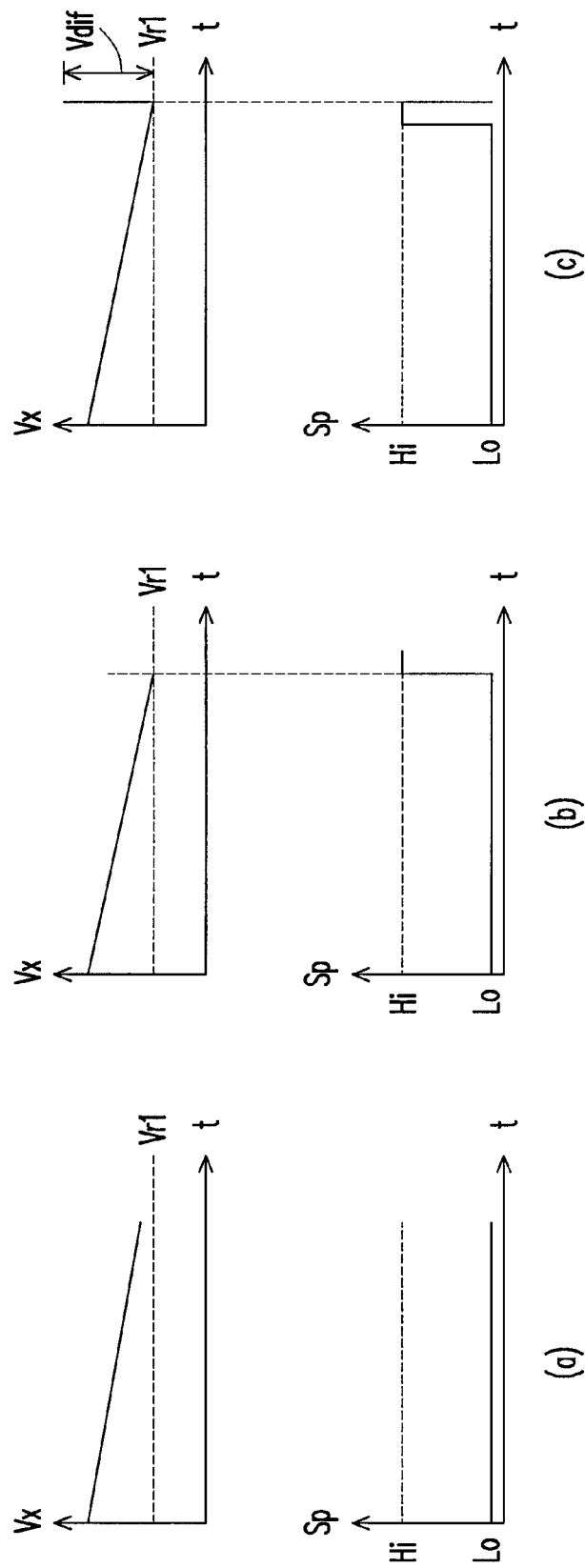
FIG. 3 is a signal waveform diagram of a sensing voltage and a pulse signal in different circuit operation stages according to the first embodiment of the invention.

FIG. 3 is a signal waveform diagram of the sensing voltage and the pulse signal in different circuit operation stages. Referring to FIG. 1 and FIG. 3, in FIG. 3(a), in the beginning, the pulse signal Sp output by the comparator comp has a low level Lo, the switches T1, T3a and T3b are in a turn on state, and the switches T2a and T2b are in a turn off state. Now, the current I flows into the first capacitor Ci to cause decreasing of the sensing voltage Vx, and the N-bit counter 132 does not count.

In FIG. 3(b), after the sensing voltage Vx is decreased for a period of time, the sensing voltage Vx is smaller than the second reference signal Vr1. Now, the comparator comp outputs the pulse signal Sp with a high level Hi, so that a counting value of the N-bit counter 132 is added by 1, and the first feedback signal Sp_B turns off the switch T1. On the other hand, the charge-discharge mechanism of the second capacitor Cc driven by the clock signal CLK is also activated to enter a charging state. Namely, when the clock signal CLK has the high level, the feedback signals Sw1 and Sw2 respectively have the high level and the low level, and accordingly the switches T2a and T2b are in the turn on state, and the switches T3a and T3b are in the turn off state, so that the second capacitor Cc is charged, and a charging voltage thereof is the second voltage Vx1.

In FIG. 3(c), the charge-discharge mechanism of the second capacitor Cc driven by the clock signal CLK enters a discharging state. According to a principle of charge conservation, the sensing voltage Vx is increased by the voltage difference Vdif, and a magnitude thereof is Vdif=Vx1×Cc/Ci. Therefore, since the sensing voltage Vx is increased to be greater than the second reference voltage Vr1, the comparator comp outputs the pulse signal Sp with the low level. In other words, the circuit operation is return back to the stage of FIG. 3(a), though the counting value of the N-bit counter 132 is added by 1.

Then, the current sensing circuit 100 is repeatedly operated in the above three different stages until a required resolution is read. In the present embodiment, regarding the so-called "resolution", taking a required resolution of 8 bits as an example, in case that a frequency of the clock signal CLK is 1 MHz, a required converting time is, for example, 1 μs×256=256 μs. When the current I is relatively great, the above three different stages are repeatedly executed for relatively more times, and the counting value of the N-bit counter 132 is relatively great. Conversely, when the current I is small, the counting value of the N-bit count 132 is relatively small. Therefore, according to the above current-digital signal conversion method of the current sensing circuit 100 of the present embodiment, the required resolution thereof is proportional to the converting time, and the higher the required resolution is, the longer the required converting time is, so that in applications of slow current variation, the current sensing circuit 100 may also achieve a high bit resolution.

In the present embodiment, the current I to be sensed flows in to the current sensing circuit, and in a second embodiment, the current I to be sensed flows out from the current sensing circuit, so that current reading methods and circuit patterns of both are slightly different.

Second Embodiment

Figure 4:
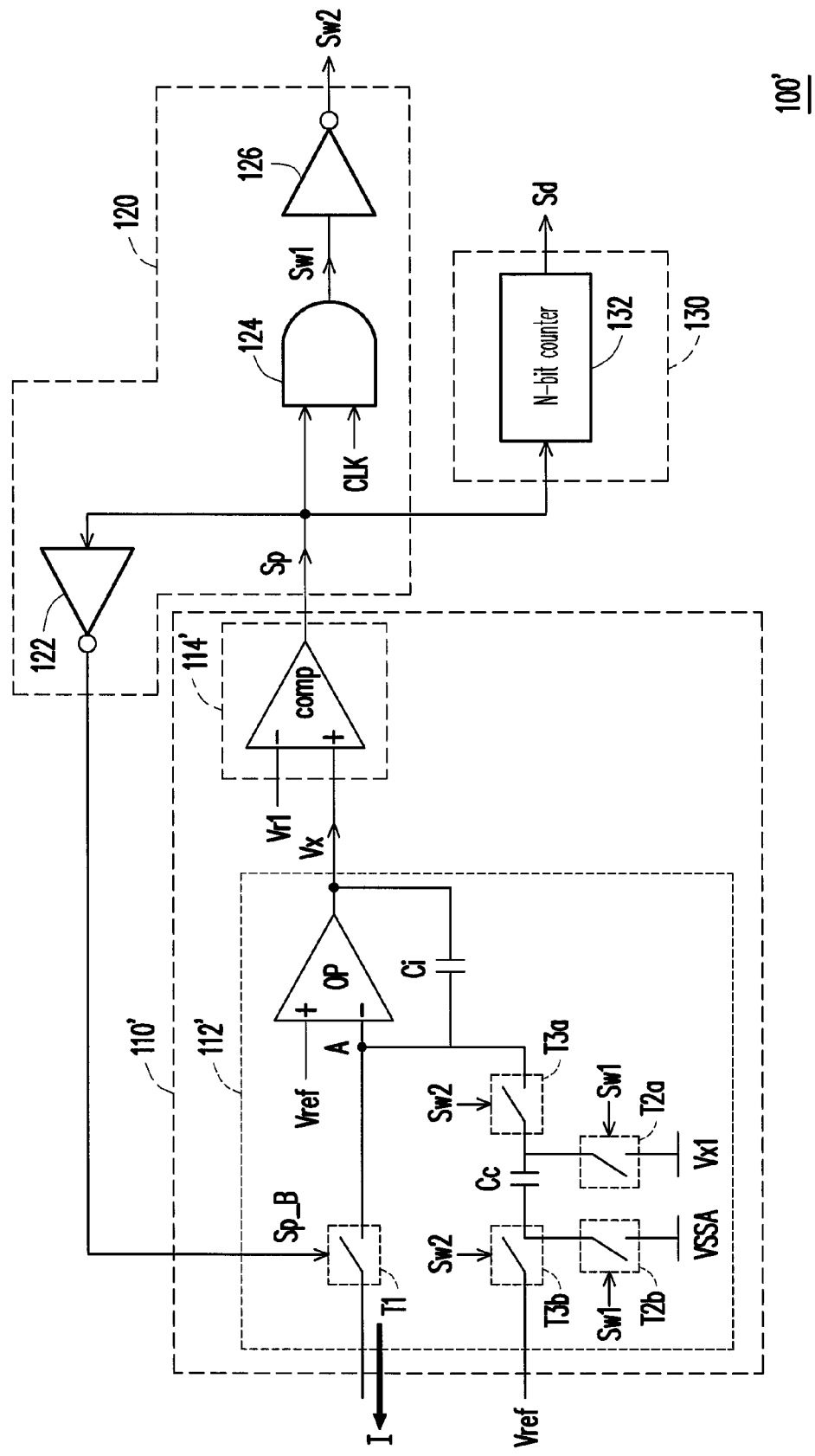
FIG. 4 is a schematic diagram illustrating a current sensing circuit according to a second embodiment of the invention.

FIG. 4 is a schematic diagram illustrating a current sensing circuit according to a second embodiment of the invention. Referring to FIG. 1 and FIG. 4, the current sensing circuit 100' of the present embodiment is similar to the current sensing circuit 100 of the first embodiment, and a main difference there between lies in, for example, a flowing direction of the current I to be sensed, and a circuit pattern of the current sensing unit 110'. The same or similar parts of both are not repeated herein.

In the present embodiment, one end of the second capacitor Cc is coupled to the first reference signal Vref or the first voltage VSSA according to the second feedback signal Sw1 and the third feedback signal Sw2. Another end of the second capacitor Cc is coupled to the inverting terminal of the operation amplifier OP or the second voltage Vx1 according to the second feedback signal Sw1 and the third feedback signal Sw2. A comparator 114' includes a comparator comp. An inverting terminal (i.e. a first terminal) of the comparator comp is coupled to the second reference signal Vr1. A non-inverting terminal (i.e. a second terminal) of the comparator comp is coupled to the output terminal of the operation amplifier OP for receiving the sensing voltage Vx. The comparator comp compares the sensing voltage Vx and the second reference voltage Vr1 to output the pulse signal Sp through its output terminal.

Figure 5:
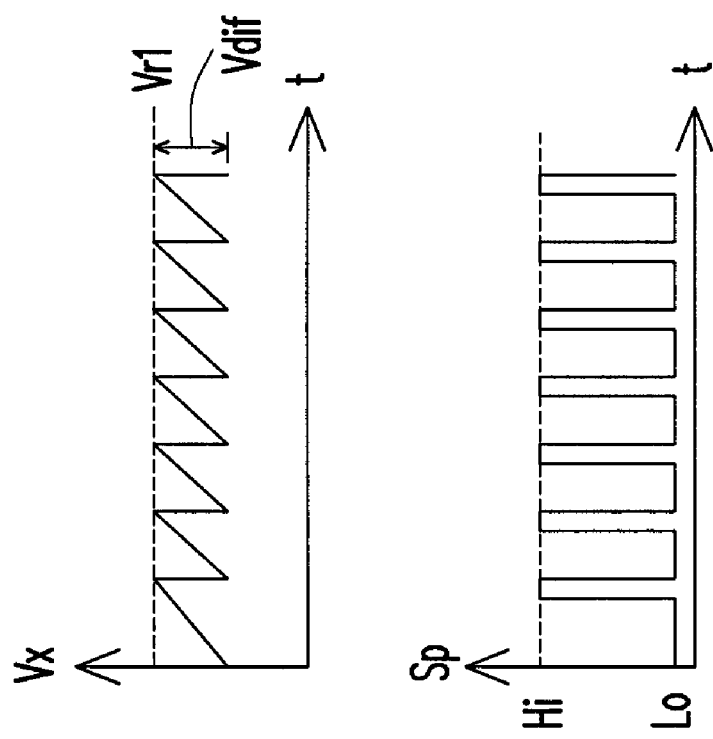
FIG. 5 is a signal waveform diagram of a sensing voltage and a pulse signal according to the second embodiment of the invention.

In detail, FIG. 5 is a signal waveform diagram of the sensing voltage and the pulse signal. Referring to FIG. 4 and FIG. 5, in the present embodiment, the current I to be sensed flows out from the node A. Since the voltage of the node A is constant, a magnitude of the sensing voltage Vx is increased as the current I flows out from the node A, and a rising slope (i.e. dV/dt) thereof is equal to I/Ci. Therefore, the greater the current I is, the greater (the steeper) an absolute value of the slop is. Since a coupling method of the comparator comp is different, when the sensing voltage Vx is greater than the second reference signal Vr1, the comparator comp output the pulse signal Sp with the high level. Now, the high level pulse signal Sp turns off the switch T1, and activates the charge-discharge mechanism of the second capacitor Cc, so that the sensing voltage Vx is decreased by Vdif.

Then, the comparator comp outputs the pulse signal Sp with the low level, so as to turn on the switch T1, so that the current I flows out from the node A until the sensing voltage Vx is again increased to be greater than the second reference signal Vr1, and accordingly the comparator comp outputs the pulse signal Sp with the high level. Therefore, within the predetermined time period, the N-bit counter counts the amount of pulses of the pulse signal Sp (i.e. the number of the high level pulse signals Sp), and the amount of the pulses represents the value of the current I sensed by the current sensing unit 110', which is a final digital output of the current value.

Figure 6:
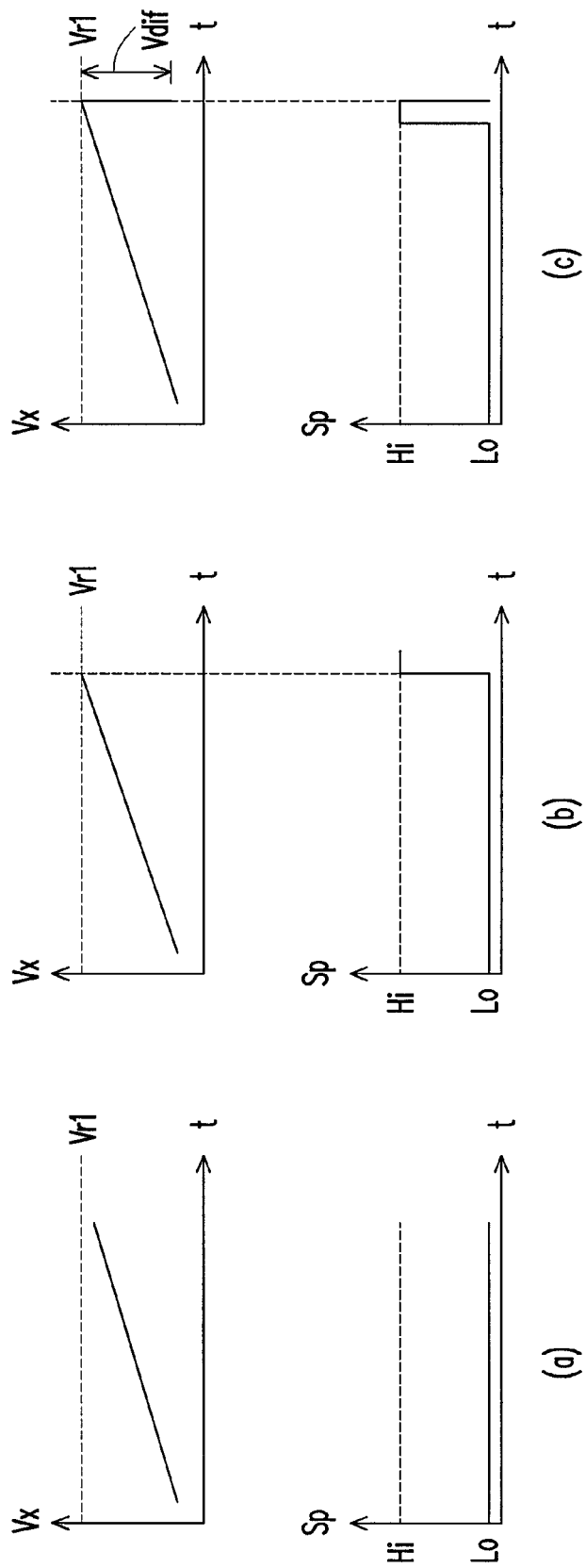
FIG. 6 is a signal waveform diagram of a sensing voltage and a pulse signal in different circuit operation stages according to the second embodiment of the invention.

FIG. 6 is a signal waveform diagram of the sensing voltage and the pulse signal in different circuit operation stages. Referring to FIG. 4 and FIG. 6, in FIG. 6(a), in the beginning, the pulse signal Sp output by the comparator comp has a low level Lo, the switches T1, T3a and T3b are in the turn on state, and the switches T2a and T2b are in the turn off state. Now, the current I flows out from the node A to cause increasing of the sensing voltage Vx, and the N-bit counter 132 does not count.

In FIG. 6(b), after the sensing voltage Vx is increased for a period of time, the sensing voltage Vx is greater than the second reference signal Vr1. Now, the comparator comp outputs the pulse signal Sp with a high level Hi, so that a counting value of the N-bit counter 132 is added by 1, and the first feedback signal Sp_B turns off the switch T1. On the other hand, the charge-discharge mechanism of the second capacitor Cc driven by the clock signal CLK is also activated to enter the charging state.

In FIG. 6(c), the charge-discharge mechanism of the second capacitor Cc driven by the clock signal CLK enters the discharging state. The sensing voltage Vx is decreased by the voltage difference Vdif. Therefore, since the sensing voltage Vx is decreased to be less than the second reference voltage Vr1, the comparator comp outputs the pulse signal Sp with the low level. In other words, the circuit operation is return back to the stage of FIG. 6(a), though the counting value of the N-bit counter 132 is added by 1. Then, the current sensing circuit 100' is repeatedly operated in the above three different stages until a required resolution is read.

In summary, according to the current sensing circuit of the exemplary embodiments of the invention, not only a circuit complexity is reduced, but also an offset effect or a nonlinearity effect of the digital signal caused by current-voltage conversion can be mitigated. Moreover, in applications of slow current variation, the current sensing circuit can also achieve a high bit resolution.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A current sensing circuit, comprising:
   a current sensing unit for sensing a current and generating a pulse signal according to at least one reference signal and at least one feedback signal;
   a feedback control unit coupled to the current sensing unit and generating the at least one feedback signal according to a clock signal and the pulse signal; and
   a digital output unit coupled to the current sensing unit and outputting a digital signal according to the pulse signal, wherein the digital output unit counts an amount of pulses of the pulse signal in a predetermined time period to output the digital signal, and the amount of pulses is positively correlated with a value of the current.

2. The current sensing circuit as claimed in claim 1, wherein the current sensing unit comprises:
   a sensing unit for sensing the current and generating a sensing voltage according to a first reference signal and the at least one feedback signal; and
   a comparison unit coupled to the sensing unit and comparing levels of the sensing voltage and a second reference signal to output the pulse signal.

3. The current sensing circuit as claimed in claim 2, wherein the sensing unit comprises:
   an operation amplifier comprising a first terminal, a second terminal and an output terminal, wherein the first terminal receives the current according to a first feedback signal, the second terminal is coupled to the first reference signal, and the output terminal outputs the sensing voltage;
   a first capacitor having one end coupled to the output terminal of the operation amplifier, and another end coupled to the first terminal of the operation amplifier; and
   a second capacitor having one end coupled to the first terminal of the operation amplifier or a first voltage according to a second feedback signal and a third feedback signal, and another end coupled to the first reference signal or a second voltage according to the second feedback signal and the third feedback signal.

4. The current sensing circuit as claimed in claim 3, wherein the comparison unit comprises:
   a comparator comprising a first terminal, a second terminal and an output terminal, wherein the first terminal is coupled to the output terminal of the operation amplifier and receives the sensing voltage, the second terminal is coupled to a second reference signal, and the comparator compares the sensing voltage and the second reference signal to output the pulse signal through the output terminal.

5. The current sensing circuit as claimed in claim 2, wherein the sensing unit comprises:
   an operation amplifier comprising a first terminal, a second terminal and an output terminal, wherein the current flows out from the first terminal according to a first feedback signal, the second terminal is coupled to the first reference signal, and the output terminal outputs the sensing voltage;
   a first capacitor having one end coupled to the output terminal of the operation amplifier, and another end coupled to the first terminal of the operation amplifier; and
   a second capacitor having one end coupled to the first reference signal or a first voltage according to a second feedback signal and a third feedback signal, and another end coupled to the first terminal of the operation amplifier or a second voltage according to the second feedback signal and the third feedback signal.

6. The current sensing circuit as claimed in claim 5, wherein the comparison unit comprises:
   a comparator comprising a first terminal, a second terminal and an output terminal, wherein the first terminal is coupled to a second reference signal, the second terminal is coupled to the output terminal of the operation amplifier and receives the sensing voltage, and the comparator compares the sensing voltage and the second reference signal to output the pulse signal through the output terminal.

7. The current sensing circuit as claimed in claim 1, wherein the feedback control unit comprises:
- a first inverter coupled to the current sensing unit and inverts the pulse signal so as to generate a first feedback signal;
- an AND gate comprising a first terminal, a second terminal and an output terminal, wherein the first terminal is coupled to the current sensing unit and receives the pulse signal, the second terminal receives the clock signal, and the AND gate outputs a second feedback signal through the output terminal according to the pulse signal and the clock signal; and
- a second inverter coupled to the AND gate and inverts the second feedback signal so as to generate a third feedback signal.

8. The current sensing circuit as claimed in claim 1, wherein the digital output unit comprises:
- an N-bit counter coupled to the current sensing unit and counts the amount of pulses of the pulse signal in the predetermined time period to output the digital signal.

* * * * *